(12) United States Patent
Leem (10) Patent No.: US 8,848,448 B2
(45) Date of Patent: Sep. 30, 2014

(54) SEMICONDUCTOR MEMORY DEVICE AND OPERATING METHOD THEREOF

(71) Applicant: SK Hynix Inc., Icheon-si (KR)

(72) Inventor: Jong Soon Leem, Icheon-si (KR)

(73) Assignee: SK Hynix Inc., Icheon-Si (KR)

( * ) Notice: Subject to any disclaimer, the term of this patent is extended or adjusted under 35 U.S.C. 154(b) by 0 days.

(21) Appl. No.: 13/715,164

(22) Filed: Dec. 14, 2012

(65) Prior Publication Data

US 2014/0043910 A1    Feb. 13, 2014

(30) Foreign Application Priority Data

Aug. 10, 2012 (KR) .................. 10-2012-0087775

(51) Int. Cl.
| | |
|---|---|
| *G11C 16/10* | (2006.01) |
| *G11C 16/12* | (2006.01) |
| *G11C 16/02* | (2006.01) |
| *G11C 16/06* | (2006.01) |
| *G11C 16/04* | (2006.01) |

(52) U.S. Cl.
CPC ............... *G11C 16/04* (2013.01); *G11C 16/02* (2013.01); *G11C 16/06* (2013.01)
USPC ........... 365/185.19; 365/185.28; 365/185.29; 365/185.33

(58) Field of Classification Search
CPC ........................................ G11C 16/10
USPC ........................................ 365/185.19
See application file for complete search history.

(56) References Cited

U.S. PATENT DOCUMENTS

| | | | | |
|---|---|---|---|---|
| 5,218,569 | A * | 6/1993 | Banks ................. | 365/185.19 |
| 5,751,635 | A * | 5/1998 | Wong et al. .......... | 365/185.19 |
| 6,259,627 | B1 * | 7/2001 | Wong .................. | 365/185.21 |
| 6,862,217 | B2 * | 3/2005 | Kawabata ............ | 365/185.18 |
| 7,054,193 | B1 * | 5/2006 | Wong .................. | 365/185.18 |
| 2013/0088917 | A1 * | 4/2013 | Park et al. ........... | 365/185.03 |

FOREIGN PATENT DOCUMENTS

| | | |
|---|---|---|
| KR | 1020090118384 A | 11/2009 |
| KR | 1020100054705 A | 5/2010 |

* cited by examiner

*Primary Examiner* — Son Mai
(74) *Attorney, Agent, or Firm* — Haynes and Boone, LLP (57) ABSTRACT

A semiconductor memory device and a method of operating same includes reading a number of program/erase operations stored in a program/erase number storage unit, setting a pulse width of a program voltage based on the read number of program/erase operations, and performing a program operation on memory cells using the program voltage having the set pulse width. Setting of the pulse width of the program voltage includes decreasing the pulse width of the program voltage as the number of program/erase operations increases.

16 Claims, 5 Drawing Sheets

SEMICONDUCTOR MEMORY DEVICE AND OPERATING METHOD THEREOF

CROSS-REFERENCE TO RELATED APPLICATION

This application is based on and claims priority from Korean Patent Application No. 10-2012-0087775, filed on Aug. 10, 2012, with the Korean Intellectual Property Office, the disclosure of which is incorporated herein in its entirety by reference.

BACKGROUND

The present invention relates to a semiconductor memory device and a method of operation thereof, and more particularly, to a semiconductor memory device and method of operation capable of improved data reliability.

A semiconductor memory may include memory devices embodied by using a semiconductor such as silicon Si, germanium Ge, gallium arsenide GaAs, indium phospide Inp, etc. The semiconductor memory may be divided into a volatile memory device and a non-volatile memory device.

Volatile memory devices may include memory devices where stored data becomes lost if a power is not supplied. The volatile memory devices may include a static RAM SRAM, a dynamic RAM DRAM, a synchronous DRAM SDRAM and so on. Non-volatile memory devices may include memory devices where stored data remains though a power is not supplied. The non-volatile memory devices may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. Flash memory devices may include NOR-type memory devices and NAND-type memory devices.

It would be advantageous to have improved semiconductor memory devices with a higher data reliability.

SUMMARY

According to some embodiments, a semiconductor memory device and method of operation capable of improving data reliability includes performing a program operation in which a pulse width of a program voltage is changed based on the number of program/erase operations of the semiconductor memory device.

An embodiment of the present invention provides a method of operating a semiconductor memory device including reading a number of program/erase operations stored in a program/erase number storage unit, setting a pulse width of a program voltage based on the read number of program/erase operations, and performing a program operation on memory cells using the program voltage having the set pulse width. Setting the pulse width of the program voltage includes decreasing the pulse width of the program voltage as the number of program/erase operations increases.

Another embodiment of the present invention provides a method of operating a semiconductor memory device including reading the number of program/erase operations stored in a program/erase number storage unit, setting a time to apply a program voltage based on the number of program/erase operations, and performing a program operation on memory cells by applying a program voltage to a selected word line for the set time. Setting the time to apply the program voltage includes decreasing the time to apply the program voltage as the number of program/erase operations increases.

Yet another embodiment of the present invention provides a semiconductor memory device including memory cells connected to a word line, a program/erase number storage unit configured to store the number of program/erase operations of the memory cells, and a controller configured to apply a program voltage to the word line based on the number of program/erase operations when a program operation is performed. A pulse width of the program volate is decreased as the number of program/erase operations increases.

Yet another embodiment of the present invention provides a semiconductor memory device including memory cells connected to a word line, a program/erase number storage unit configured to store the number of program/erase operations of the memory cells, and a controller configured to apply a program voltage to the word line based on the number of program/erase operations when a program operation is performed. A time to apply the program voltage decreases as the number of program/erase operations increases.

According to some embodiments of the present invention, it is possible to improve a reliability of stored data by performing the program operation with a program voltage in which a pulse width is changed based on the number of program/erase operations performed on a semiconductor memory device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become readily apparent by the following detailed description when considered in conjunction with the accompanying drawings.

DETAILED DESCRIPTION

Hereinafter, embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

According to some embodiments, in order to store data in a memory cell of a semiconductor memory device, a program operation is performed to increase a threshold voltage of the memory cell. If a high voltage is applied to a control gate during the program operation, electron flow to a floating gate may occur by field emission and/or Fowler-Nordheim (FN) tunneling. The electron flow may increase the threshold voltage of the memory cell.

As a result of a repeated application of program/erase operations to the memory cell, the electrons which have flowed to the floating gate may become trapped in a tunnel oxidation layer, and/or the like. In some embodiments, as a number of program/erase operations increases, a speed of the program operation of the memory cell may increase as well.

Even though the program operation speed of the memory cell increases due to the number program/erase operations, when the program operation is performed with the same program voltage, there may be a deterioration in data reliability.

Figure 1:
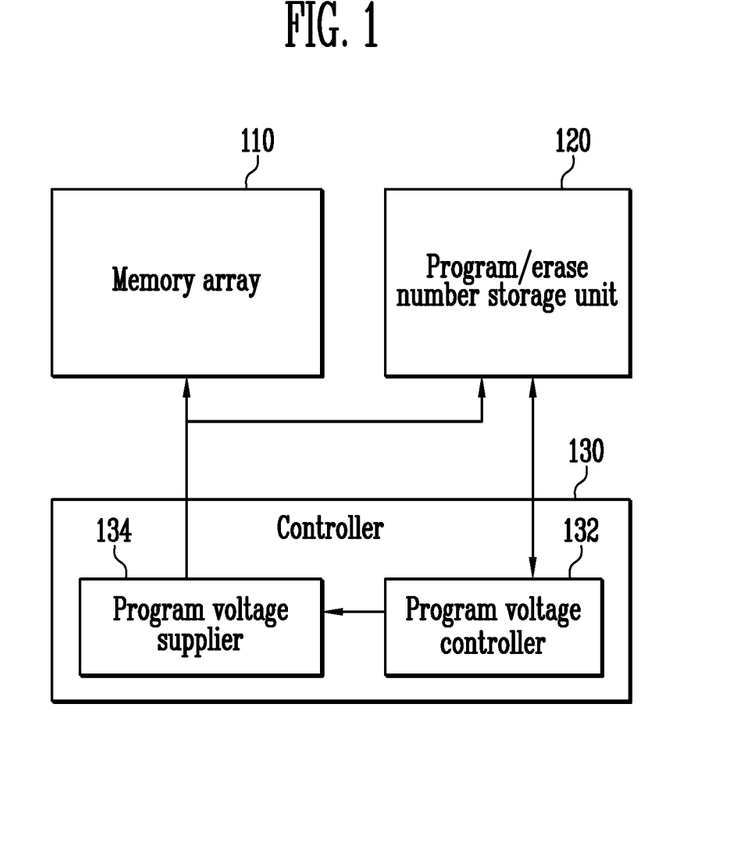
FIG. 1 is a block diagram of a semiconductor memory device according to some embodiments.

FIG. 1 is a block diagram of a semiconductor memory device according to some embodiments.

As shown in FIG. 1, a semiconductor memory device may include a memory array 110, a program/erase number storage unit 120, and a controller 130.

The memory array 110 may include a plurality of memory blocks. Each memory block may include a plurality of memory cells connected to a word line. Data may be stored in each of the memory cells.

The program/erase number storage unit 120 may be configured to store a number of program/erase operations performed on the memory cells. In some embodiments, the program/erase number storage unit 120 may include various parameters necessary for an operation of the semiconductor memory device and/or flag cells in which operational data may be stored.

The controller 130 may control various operations of the semiconductor memory device. The controller 130 includes a program voltage controller 132 and a program voltage supplier 134. The program voltage controller 132 may be configured to output a first control signal for changing a pulse width of a program voltage and/or a length of a program pulse based on the number of program/erase operations. The program voltage supplier 134 may be configured to supply a program voltage whose pulse width is changed based on the first control signal output from the program voltage controller 132.

In some embodiments, the program voltage controller 132 may output the first control signal so that the pulse width of the program voltage may be decreased as the number of program/erase operations increases.

In some embodiments, the program voltage controller 132 may be configured to output a second control signal for adjusting a duration to apply the program voltage based on the number of program/erase operations. In some embodiments, the program voltage supplier 134 may adjust the duration to apply the program voltage based on the second control signal output from the program voltage controller 132.

In some embodiments, the program voltage controller 132 may output the second control signal so that a length of the duration to apply the program voltage may be decreased as the number of program/erase operations increases.

The program voltage controller 132 may read information associated with the number of program/erase operations that may be stored in the program/erase number storage unit 120. The program voltage controller 132 may additionally store a temporary copy of the number of program/erase operations before an erase operation is performed. In some embodiments, the erase operation may be a block erase operation. In some embodiments, the erase operation may erase flag cells. In some embodiments, the copy may be stored in order to prevent the number of program/erase operations from being erased by the erase operation. In some embodiments, a reading operation may be performed on the memory cells and/or the flag cells in the program/erase number storage unit 120.

In some embodiments, when the program operation for all pages of a selected memory block is completed and/or the erase operation is completed on the selected memory block, the program voltage controller 132 may increase the temporary copy of the number of program/erase operations by "1" and store the result in the program/erase number storage unit 120. In some embodiments, the program voltage controller 132 may increase the number program/erase operations for the selected memory block by "1" after the completion of the program operation for all pages of the selected memory block. In some embodiments, the program voltage controller 132 may increase the number of program/erase operations for the selected memory block by "1" after completion of the erase operation for the selected memory block. In some embodiments the program operation may be performed on the flag cells of the program/erase number storage unit 120.

Figure 2:
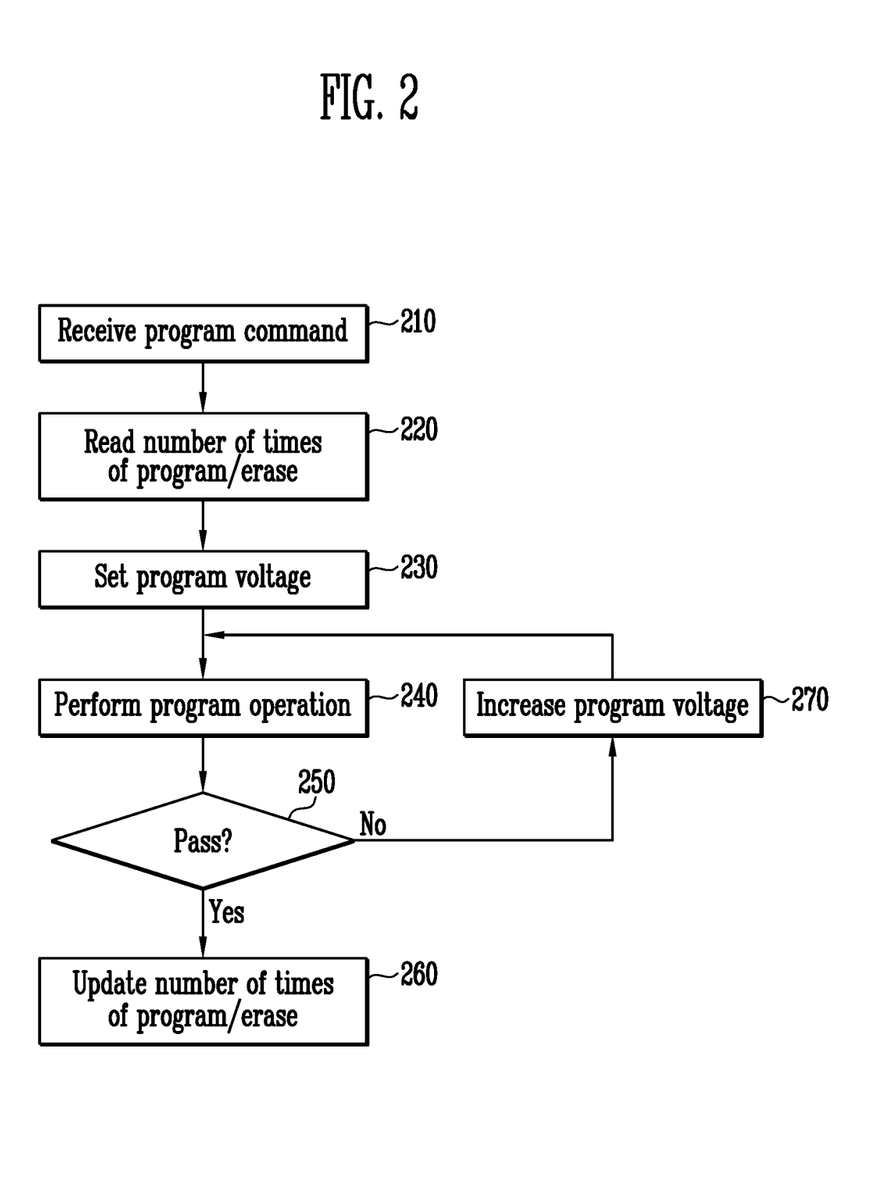
FIG. 2 is a flowchart of a method of operation of a semiconductor memory device according to some embodiments.

FIG. 2 is a flowchart of a method of operation of a semiconductor memory device according to some embodiments.

As shown in FIG. 2, a semiconductor memory device may receive a program command from a host at a process 210. At a process 220, the controller may read the number of program/erase operations stored in the program/erase number storage unit 120. In some embodiments, the program/erase number storage unit 120 may include the flag cells, so that the program/erase number storage unit 120 may read the number of program/erase operations from the flag cells. In some embodiments, the program/erase number storage unit 120 may be read by a reading operation performed on a memory cell.

At a process 230, a program voltage may be set based on the number of program/erase operations.

According to certain embodiments, a pulse width of the program voltage may be set at an initial operation to a wide value when the number of program/erase operations is small and the pulse width of the program voltage may be set to a narrower value as the number of program/erase operations is increased. In some embodiments, the pulse width may be set to the narrower value when the number program/erase operations exceeds one of several thresholds in a reset reference value Ref(n).

In some examples, the reset reference value may include several thresholds as follows:
Ref(n)={1, 100, 500, 1000, ... },
Ref(n)={1, 1K, 5K, 10K, 15K, 20K, ... },
Ref(n)={1, 1K, 10K, 20K, 30K, ... }, or
Ref(n)={1, 1K, 10K, 100K, 1000K, ... }.

In some embodiments, the reset reference value may be changed by a designer according to a characteristic of the semiconductor memory device. In some embodiments, the reset reference value may be set so that the pulse width of the program voltage may be narrowed whenever each of the several thresholds in the reset reference value is exceeded.

According to some embodiments, the pulse width of a program voltage may be initially set to Vw(0) before any program/erase cycle is performed. The pulse width of the program voltage may be narrowed when the number of program/erase operations reaches a next reset reference value selected from the several thresholds.

In some examples, the pulse width may be initially set to Vw(0).

In some examples, when the number of program/erase operations reaches Ref(1), the pulse width is set to Vw(1), with Vw(1) being narrower than Vw(0).

In some examples, when the number of program/erase operations reaches Ref(N), the pulse width is set to Vw(N), with Vw(N) being narrower than Vw(N−1).

At a process 240, the program voltage may be applied to a selected word line to perform a program operation. In some embodiments, the program voltage may be applied to the selected word line connected with the memory cells in the memory array 110 through the program voltage supplier 134.

At a process 250, it may be determined whether the threshold voltages of the memory cells are equal to or larger than a verification voltage during a verification operation. When the threshold voltage of a memory cell is lower than the verification voltage, a pulse height of the program voltage may be increased by a value Vstep in a process 270 and then the program operation 240 may be repeated.

When the threshold voltages of all of the memory cells are equal to or larger than the verification voltage, the number of program/erase operations is updated in a process 260. In some embodiments, the number of program/erase operations may be re-stored in the flag cells of the program/erase operation number storage unit 120 by increasing the number of program/erase operations by "1".

In some embodiments the pulse width of the program voltage may be decreased based on the increase in the number of program/erase operations. In some embodiments, a time to apply the program voltage may be decreased based on the increase in the number of program/erase operations.

Figure 3:
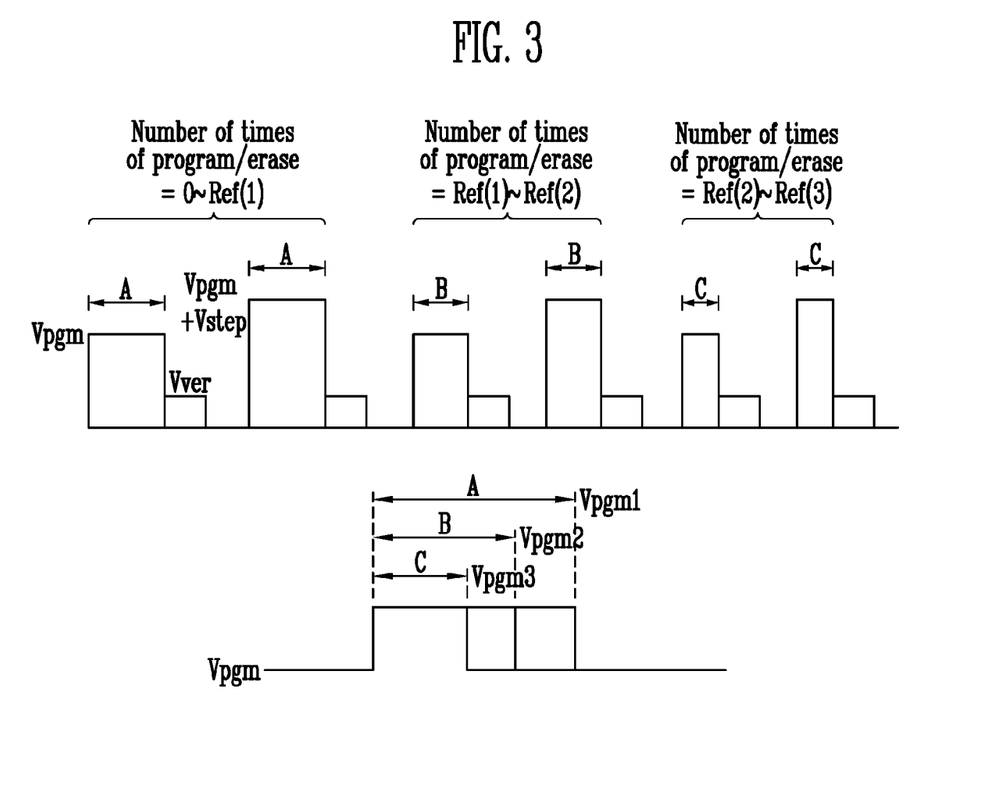
FIG. 3 is a view illustrating a voltage applied during the method of operation of the semiconductor memory device of FIG. 2 according to some embodiments.

FIG. 3 is a view illustrating a voltage applied during the method of operation of a semiconductor memory device of FIG. 2 according to some embodiments.

As shown in FIG. 3, when the number of program/erase operations is less than Ref(1), the program operation may be performed using a pulse width A.

When the number of program/erase operations reaches Ref(1), the pulse width may be set to a pulse width B. Until the number of program/erases operations reaches Ref(2), the program operation may be performed using the pulse width B, which is narrower than the pulse width A.

When the number of program/erase operations reaches Ref(2), the pulse width may be set to a pulse width C. Until the number of program/erase operations reaches Ref(3), the program operation may be performed using a pulse width C, which is narrower than the pulse width B.

According to some embodiments, the program operation may be performed using a pulse width of the program voltage which decreases based on an increase in the number of program/erase operations.

According to some embodiments, even though the number of program/erase cycles may have increased, data reliability may be improved.

Figure 4:
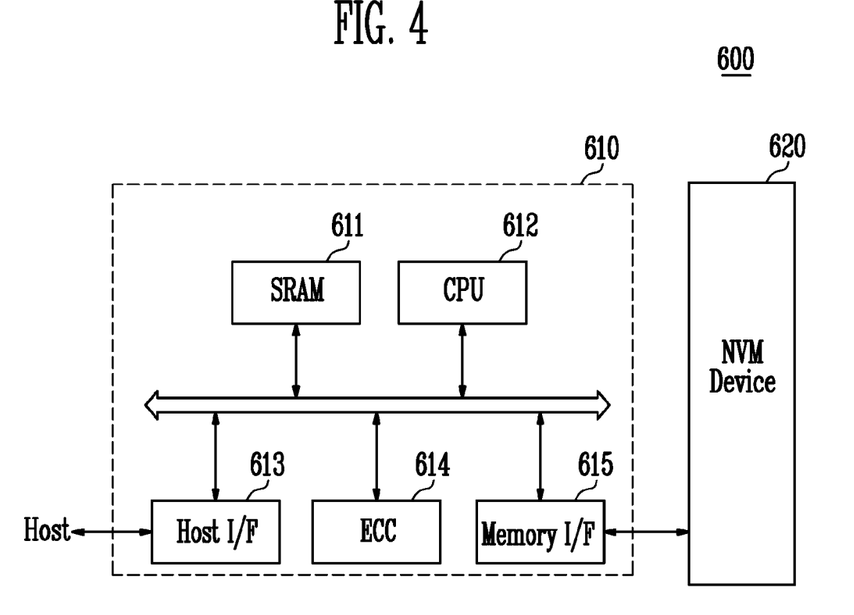
FIG. 4 is a block diagram schematically illustrating a memory system according to some embodiments.

FIG. 4 is a block diagram schematically illustrating a memory system according to some embodiments.

As shown in FIG. 4, a memory system 600 may include a non-volatile memory device 620 and a memory controller 610.

The non-volatile memory device 620 may include the semiconductor memory device of FIG. 1. A memory controller 610 may be configured to control the non-volatile memory device 620. A memory card or a semiconductor disk device (Solid State Disk: SSD) may be provided through a combination of the non-volatile memory device 620 and the memory controller 610. The static ram (SRAM) 611 may be used as an operation memory of a processing unit (CPU) 612. A host interface 613 may utilize a data exchange protocol to communicate with a host connected with the memory system 600. An error correction block 614 may detect and correct errors included in data read from the non-volatile memory device 620. The memory interface 614 may interface the memory controller 610 with the non-volatile memory device 620. The processing unit 612 may perform control operations for data exchanges made by the memory controller 610.

Although not illustrated in FIG. 4, ROM may be used for storing executable code that when run by the processing unit 612, may cause the processing unit 612 to perform the control operations of the memory controller 610. The non-volatile memory device 620 may be a mufti-chip package including a plurality of flash memory chips. The memory system 600 may be provided as part of a storage medium with high reliability and low error generation probability. In some embodiments, the memory system 600 may be included in a memory system, such as a SSD. In some embodiments, the memory controller 610 may be configured to communicate with an external device (for example, the host) using one or more interface protocols, such as USB, MMC, PCI-E, SATA, PATA, SCSI, ESDI, and/or IDE and the like.

Figure 5:
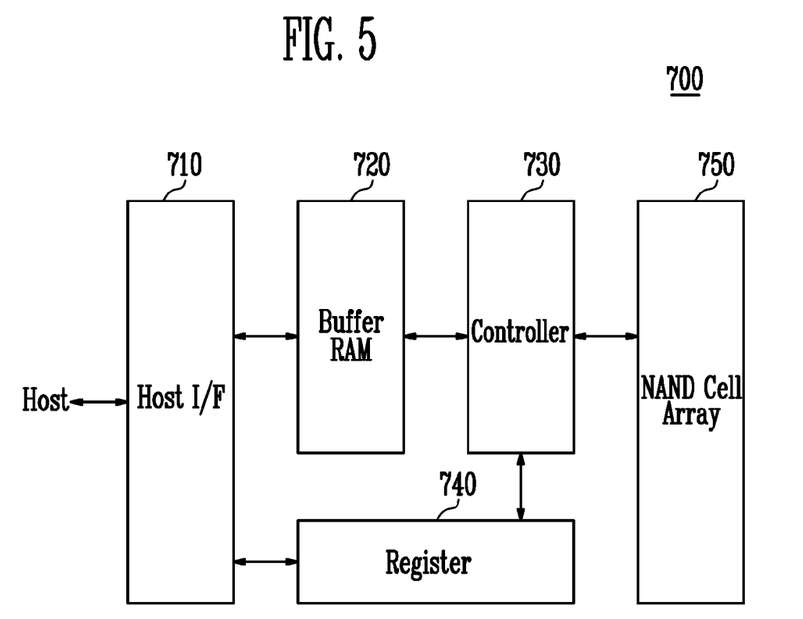
FIG. 5 is a block diagram schematically illustrating a fusion memory device according to some embodiments.

FIG. 5 is a block diagram schematically illustrating a fusion memory device according to some embodiments. In some embodiments, the semiconductor memory device of FIG. 1 may be applied to a One NAND flash memory device 700 as a fusion memory device.

The One NAND flash memory device 700 may include a host interface 710 for exchanging various information with a host, a buffer RAM 720 including executable code for operating the memory device 700 or temporarily storing data, a controller 730 for controlling reading, programming, erasing, and all other states of the memory device 700 in response to control signals and commands received from the host, a register 740 for storing commands, addresses, data, and configuration information for defining a system operation environment inside the memory device 700, and a NAND flash cell array 750. In some embodiments, the One NAND flash memory device may program data in response to a writing request from the host using the method of FIG. 2.

Figure 6:
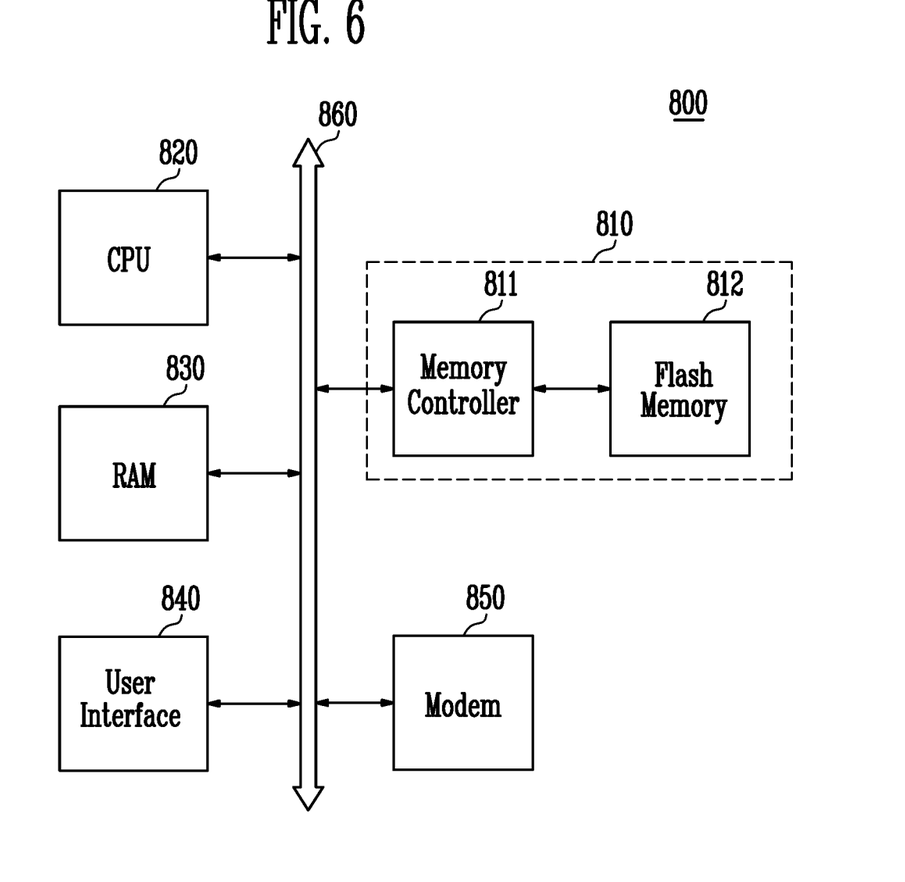
FIG. 6 is a block diagram schematically illustrating a computing system including a flash memory device according to some embodiments.

FIG. 6 is a block diagram schematically illustrating a computing system 800 including a flash memory device 812 according to some embodiments.

The computing system 800 may include a microprocessor 820 electrically connected to a system bus 860, a RAM 830, a user interface 840, a modem 850, such as a baseband chipset, and a memory system 810. In some embodiments, the computing system 800 may be a mobile device, and a battery (not shown) for supplying an operation voltage of the computing system 800 may be additionally provided. Although not illustrated in FIG. 6, the computing system 800 may further include an application chipset, a Camera Image Processor (CIS), a mobile DRAM, and/or the like. In some embodiments, the memory system 810 may include, a SSD using a non-volatile memory for storing data. In some embodiments, the memory system 810 may be a fusion flash memory (for example, the One NAND flash memory of FIG. 5).

Additionally, some embodiments may include non-transient, tangible machine-readable media that includes executable code that when run by one or more processors, may cause the one or more processors to perform the steps of methods described herein. Some common forms of machine readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
   reading a number of program/erase operations stored in a program/erase number storage unit;
   setting a pulse width of a program voltage based on the read number of program/erase operations;
   performing a program operation on memory cells using the program voltage having the set pulse width;
   updating the number of program/erase operations; and
   storing the updated number of program/erase operations in the program/erase number storage unit;
   wherein setting the pulse width of the program voltage includes decreasing the pulse width of the program voltage as the number of program/erase operations increases.

2. The method of claim 1 wherein setting the pulse width of the program voltage includes:
   setting the pulse width to a first width when the number of program/erase operations is in a first range; and
   setting the pulse width to a second width, narrower than the first width, when the number of program/erase operations is in a second range;
   wherein an upper bound of the first range is less than a lower bound of the second range.

3. The method of claim 1 wherein the program/erase number storage unit includes a flag cell.

4. The method of claim 3, further comprising:
   when the number of program/erase operations is stored in the flag cell, reading the number of program/erase operations stored in the flag cell and temporarily storing the read number of program/erase operations before an erase operation is performed on a memory block including the flag cell.

5. A method of operating a semiconductor memory device, comprising:
   reading the number of program/erase operations stored in a program/erase number storage unit;
   setting a time to apply a program voltage based on the number of program/erase operations;
   performing a program operation on memory cells by applying the program voltage to a selected word line for the set time;
   updating the number of program/erase operations after the performing of the program operation; and
   storing the updated number of program/erase operations in the program/erase number storage unit,
   wherein setting the time to apply the program voltage includes decreasing the time to apply the program voltage as the number of program/erase operations increases.

6. The method of claim 5 wherein setting of the time to apply the program voltage includes:
   setting the time to apply the program voltage to a first length when the number of program/erase operations is in a first range; and
   setting the time to apply the program voltage to a second length, shorter than the first length, when the number of program/erase operations is in a second range;
   wherein an upper bound of the first range is less than a lower bound of the second range.

7. The method of claim 5 wherein the program/erase number storage unit includes a flag cell.

8. The method of claim 7, further comprising:
   when the number of program/erase operations is stored in the flag cell, reading the number of program/erase operations stored in the flag cell and temporarily storing the read number of program/erase operations before an erase operation is performed on a memory block including the flag cell.

9. A semiconductor memory device, comprising:
   memory cells connected to a word line;
   a program/erase number storage unit configured to store the number of program/erase operations of the memory cells, wherein the program/erase number storage unit includes a flag cell; and
   a controller configured to apply a program voltage to the word line based on the number of program/erase operations when a program operation is performed;
   wherein a pulse width of the program voltage is decreased as the number of program/erase operations increases.

10. The semiconductor memory device of claim 9 wherein:
    the pulse width is set to a first width when the number of program/erase operations is in a first range;
    the pulse width is set to a second width, narrower than the first width, when the number of program/erase operations is in a second range; and
    an upper bound of the first range is less than a lower bound of the second range.

11. The semiconductor memory device of claim 9 wherein the controller is further configured to update the number of program/erase operations and store the updated number of program/erase operations in the program/erase number storage unit after the program operation is completed.

12. The semiconductor memory device of claim 9 wherein the controller is further configured to read the number of program/erase operations stored in the flag cell and temporarily store the read number of program/erase operations before an erase operation is performed on a memory block including the flag cell when the number of program/erase operations is stored in the flag cell.

13. A semiconductor memory device, comprising:
    memory cells connected to a word line;
    a program/erase number storage unit configured to store the number of program/erase operations of the memory cells, wherein the program/erase number storage unit includes a flag cell; and
    a controller configured to apply a program voltage to the word line based on the number of program/erase operations when a program operation is performed;
    wherein a time to apply the program voltage decreases as the number of program/erase operations increases.

14. The semiconductor memory device of claim 13 wherein:
    the time to apply the program voltage is set to a first length when the number of program/erase operations is in a first range;
    the time to apply the program voltage is set to a second length, shorter than the first length, when the number of program/erase operations is in a second range; and
    an upper bound of the first range is less than a lower bound of the second range.

15. The semiconductor memory device of claim 13 wherein the controller is further configured to update the number of program/erase operations and store the updated number of program/erase operations in the program/erase number storage unit after the program operation is completed.

16. The semiconductor memory device of claim 9, wherein the controller is further configured to read the number of program/erase operations stored in the flag cell and temporarily store the read number of program/erase operations before an erase operation is performed on a memory block including the flag cell when the number of program/erase operations is stored in the flag cell.

* * * * *